(12) United States Patent
Chen

(10) Patent No.: US 7,600,164 B2
(45) Date of Patent: Oct. 6, 2009

(54) INTERLEAVING/DE-INTERLEAVING USING COMPRESSED BIT-MAPPING SEQUENCES

(75) Inventor: Dayong Chen, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 451 days.

(21) Appl. No.: 11/016,643

(22) Filed: Dec. 17, 2004

(65) Prior Publication Data

US 2006/0156094 A1 Jul. 13, 2006

(51) Int. Cl.
*G06F 11/00* (2006.01)
*G11C 29/00* (2006.01)

(52) U.S. Cl. .................. 714/701; 714/702

(58) Field of Classification Search ............. 714/701, 714/702

See application file for complete search history.

(56) References Cited

U.S. PATENT DOCUMENTS

| | | | |
|---|---|---|---|
| 3,652,998 A | | 3/1972 | Forney, Jr. |
| 4,641,327 A | * | 2/1987 | Wei .................. 375/365 |
| 4,901,319 A | * | 2/1990 | Ross .................. 714/788 |
| 4,907,233 A | * | 3/1990 | Deutsch et al. ............. 714/755 |
| 5,042,033 A | | 8/1991 | Costa |
| 5,077,737 A | * | 12/1991 | Leger et al. .................. 714/6 |
| 5,392,299 A | * | 2/1995 | Rhines et al. ............... 714/756 |
| 6,282,677 B1 | | 8/2001 | Inoue |
| 6,289,486 B1 | * | 9/2001 | Lee et al. .................. 714/788 |
| 6,339,834 B1 | * | 1/2002 | Crozier et al. .............. 714/701 |
| 6,347,385 B1 | * | 2/2002 | Cui et al. .................. 714/701 |
| 6,415,414 B1 | * | 7/2002 | Murayama et al. .......... 714/795 |
| 6,591,381 B1 | | 7/2003 | Kim et al. |
| 6,662,332 B1 | | 12/2003 | Kimmitt |
| 6,785,859 B2 | * | 8/2004 | Goldman .................. 714/755 |
| 6,845,482 B2 | * | 1/2005 | Yao et al. .................. 714/755 |
| 7,055,088 B2 | * | 5/2006 | Betts .................. 714/788 |
| 7,170,849 B1 | * | 1/2007 | Arivoli et al. ............... 370/208 |
| 2002/0149496 A1 | | 10/2002 | Dabak et al. |
| 2003/0163776 A1 | | 8/2003 | Prasad |
| 2005/0110663 A1 | | 5/2005 | O'Shea et al. |

FOREIGN PATENT DOCUMENTS

| | | |
|---|---|---|
| EP | 605892 | 12/1992 |
| EP | 0 660 558 | 6/1995 |
| EP | 0813309 | 12/1997 |
| EP | 1039646 | 9/2000 |
| WO | WO 95/18489 | 7/1995 |
| WO | WO 03/084121 | 3/2003 |
| WO | WO 2005/060106 | 6/2005 |

OTHER PUBLICATIONS

Ampadu et al., "An Efficient Hardware Interleaver for 3G Turbo Decoding," Aug. 10, 2003, pp. 199-201, XP10656732.
Anonymous, "Cycle-Efficient Implementation of Diagonal Interleaver for GSM/GPRS Radio," IP.com Journal, IP.com, Inc., Apr. 14, 2005, XP13024243.
Garrett et al., "Energy Efficient Turbo Decoding for 3G Mobile," Aug. 6, 2001, pp. 328-333, XP001134631.

* cited by examiner

*Primary Examiner*—Joseph D Torres
(74) *Attorney, Agent, or Firm*—Coats & Bennett, P.L.L.C.

(57) ABSTRACT

A method of mapping input bit positions in an input sequence to output bit positions in an output sequence uses compressed mapping sequences stored in memory derived from a predetermined mapping function. The mapping function is decompressed into periodic component functions that are used to generate the compressed mapping sequences. Each compressed mapping sequence comprises a plurality of partial mapping values that represent one period of a corresponding component function or group of component functions. Partial mapping values are selected from each compressed mapping sequence based on a bit index of the current input bit and summed or otherwise combined to get an output index.

28 Claims, 7 Drawing Sheets

INTERLEAVING/DE-INTERLEAVING USING COMPRESSED BIT-MAPPING SEQUENCES

BACKGROUND OF THE INVENTION

The present invention relates generally to bit-mapping, and more particularly, to methods of interleaving/de-interleaving with compressed mapping sequences.

In many types of communication channels, such as radio channels, the inherent noise causes bit errors to occur during transmission. In order to reduce bit errors, digital communication systems typically use error control codes to enable detection and/or correction of the bit errors at the receiver. These error control codes introduce controlled redundancy into the information transmitted over the communication channel, which can be used at the receiver to detect and/or correct errors in the received signal. Error detecting codes enable the receiver to detect bit errors. The receiver may then request retransmission of the information that was received in error. Error correcting codes enable the receiver to detect and correct bit errors without retransmission.

Convolutional codes are one type of forward error correcting code used in digital communication systems. Though very effective in correcting random bit errors that occur during transmission, convolutional codes are susceptible to burst errors. Random errors occur when individual bits in the transmitted bit sequence are corrupted by noise and received in error. Random errors are typically isolated and may be caused by noise in the communication channel. Burst errors occur when a series of adjacent or closely spaced bits are received in error and may be caused by fading in the communication channel. Many coding schemes have difficulty correcting burst errors.

Interleaving is a technique used to enhance the error correcting capabilities of error correcting codes, such as convolutional codes, to make them more effective against burst errors. Coded bits output by an encoder are reordered by an interleaver to spread the coded bits over time. This reordering of the coded bits in effect spreads long burst errors so that they appear to the decoder as independent random bit errors. An interleaver can be viewed as a one-to-one mapping function that maps input bits in an input sequence to a corresponding position in an equal-length output bit sequence.

Two techniques are commonly used to perform interleaving and de-interleaving—the lookup method and the calculation method. The lookup method uses pre-calculated mapping values for each input bit to map input bit positions in an input sequence to output bit positions in an output sequence. The pre-calculated mapping values comprise a mapping sequence that is stored in a look-up table. The interleaver/de-interleaver gets the output bit position for each input bit by a simple look-up operation. This look-up table method is relatively efficient in use of processing resources, but requires a relatively large amount of memory compared to the calculation approach. The calculation approach calculates the output bit position for each input bit in real time. The calculation method can be used when the mapping function can be expressed in closed form. The calculation method doesn't require any memory to store look-up tables at the cost of more processing resources.

The design of chip sets for digital communication systems is often constrained by memory rather than by processing resources. In such systems, the look-up table approach is inappropriate and a method that can achieve a better balance between memory and processing resources is often desired. Achieving a better balance between memory and processing resources may help in reducing the size and cost of chip sets for mobile communications.

SUMMARY OF THE INVENTION

The present invention provides a method of compressing bit mapping sequences and using the compressed mapping sequences to perform interleaving and de-interleaving. The present invention may be used, for example, in digital communication systems, such as wireless communication networks.

A bit mapping function is decomposed into periodic component functions. The periodic component functions are evaluated over one period to obtain two or more compressed mapping sequences. Periodic component functions having the same or compatible period may be combined to generate a single compressed mapping sequence. Each compressed mapping sequence comprises a plurality of partial mapping values that repeat within the interval of the input sequence. A mapping circuit uses the compressed mapping sequences to map input bit positions in an input sequence to corresponding output bit positions in an output sequence. The mapping circuit uses the bit index of each input bit to select partial mapping values from each compressed mapping sequence and calculates an output index, for example by adding the partial mapping values together. The output index generated for each input bit indicates the position in the output sequence to which the input bit is mapped. The compression method for compressing bit mapping functions reduces memory requirements as compared to prior art systems that store entire uncompressed mapping sequences. The use of the compressed mapping sequences to perform interleaving and de-interleaving also requires less processing resources than real-time computation of each output index based on evaluation of a mapping function.

DETAILED DESCRIPTION OF THE INVENTION

Figure 1:
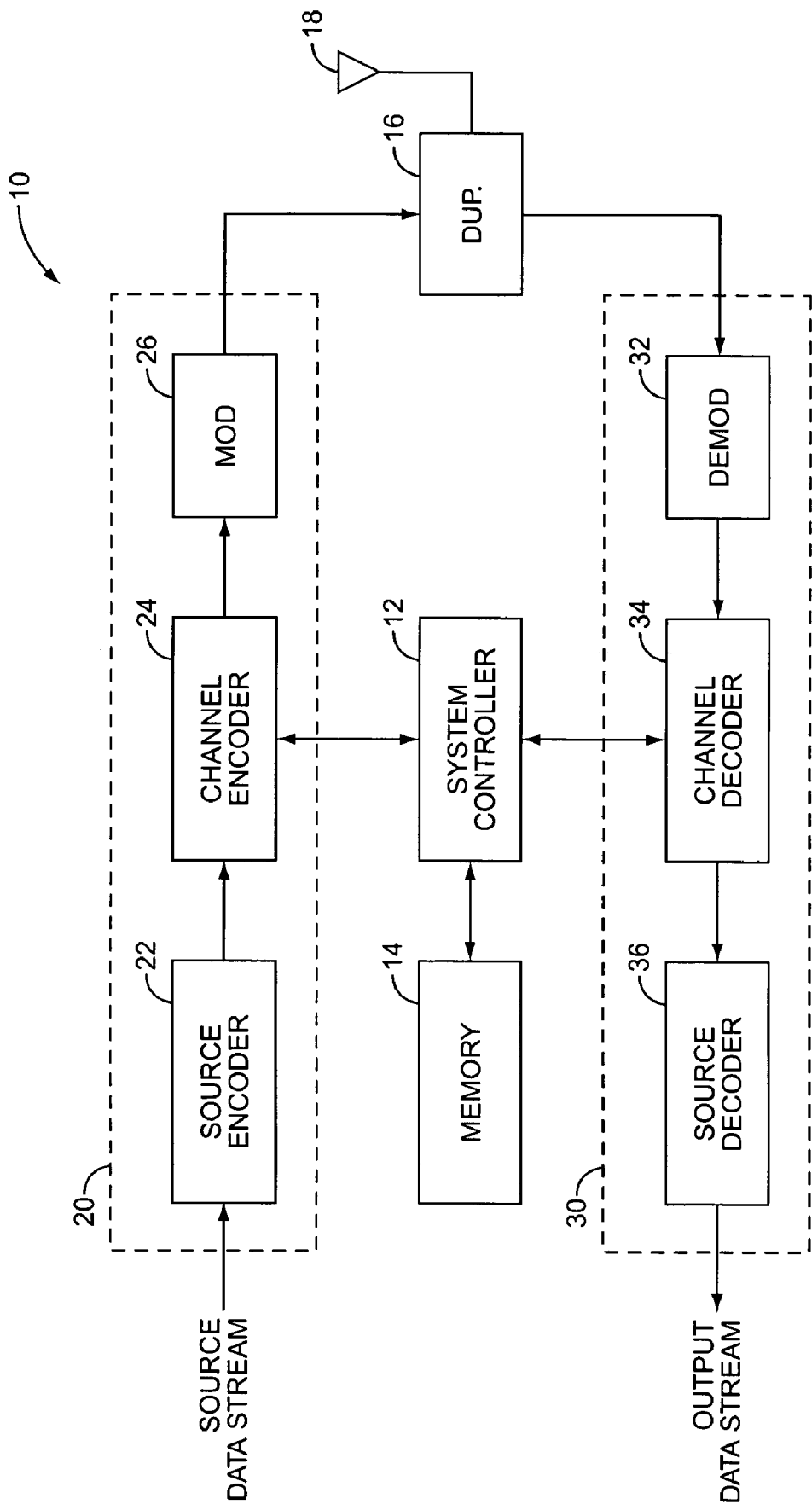
FIG. 1 is a block diagram of a mobile communication device in which the channel encoder/decoder of the present invention could be used.

FIG. 1 illustrates a mobile communication device generally indicated by the numeral 10. The mobile communication device 10 comprises a system controller 12 to control the overall operation of the mobile communication device 10, a memory 14 to store programs and data needed for operation, a transmitter 20 to transmit signals, and a receiver 30 to receive signals. The transmitter 20 and receiver 30 are coupled to a common antenna 18 by a duplexer or switch 16 that permits full duplex operation.

The transmitter 20 receives a source data stream from an information source, processes the source data stream to generate a transmit signal suitable for transmission over a radio channel, and modulates the transmit signal onto an RF carrier. The transmitter 20 includes a source encoder 22, a channel encoder 24 and a modulator 26. The source encoder 22 removes redundancy or randomizes the source data stream to produce an information sequence that has been optimized for maximum information content. For example, the source encoder may comprise a speech encoder to encode speech for transmission over the communication channel. The information sequence from the source encoder 22 is passed to the channel encoder 24. The channel encoder 24 introduces an element of redundancy into the information sequence supplied by the source encoder 22 to generate a coded output. The redundancy added by the channel encoder 24 serves to enhance the error correction capability of the communication system. By making use of the redundant information, a receiver 30 can detect and correct bit errors that may occur during transmission. The output of the channel encoder 24 is the transmit bit sequence. The modulator 26 receives the transmit bit sequence from the channel encoder 24 and generates waveforms that both suit the physical nature of the communication channel and can be efficiently transmitted over the communication channel. Typical modulation schemes used in mobile communication devices 10 include 16QAM, 8-PSK, 4-PSK, and the like.

The receiver 30 receives signals transmitted from a far-end device that has been corrupted by passage through the communication channel. The function of the receiver 30 is to reconstruct the original source data stream from the received signal. The receiver 30 includes a demodulator 32, channel decoder 34, and source decoder 36. The demodulator 32 processes the received signal and generates a received bit sequence, which may comprise hard or soft values for each received bit. If the received signal is transmitted without error through the communication channel, the received bit sequence would be identical to the transmit bit sequence at the transmitter. In actual practice, the passage of the received signal through the communication channel introduces bit errors into the received signal. The channel decoder 34 uses the redundancy added by the channel encoder 24 at the transmitter 20 to detect and correct the bit errors. A measure of how well the demodulator 32 and decoder 34 perform is the frequency with which bit errors occur in the decoded sequence. As a final step, a source decoder 36 reconstructs the original signal from the information source. The difference between the reconstructed information signal and the original information signal is a measure of the distortion introduced by the communication system.

Figure 2:
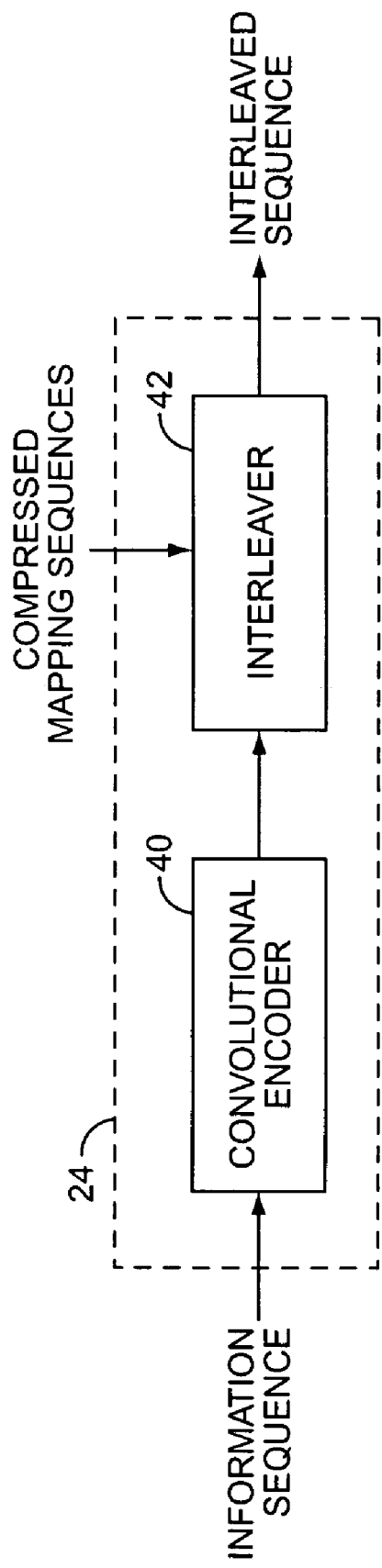
FIG. 2 is a block diagram of an exemplary channel encoder according to the present invention.
Figure 3:
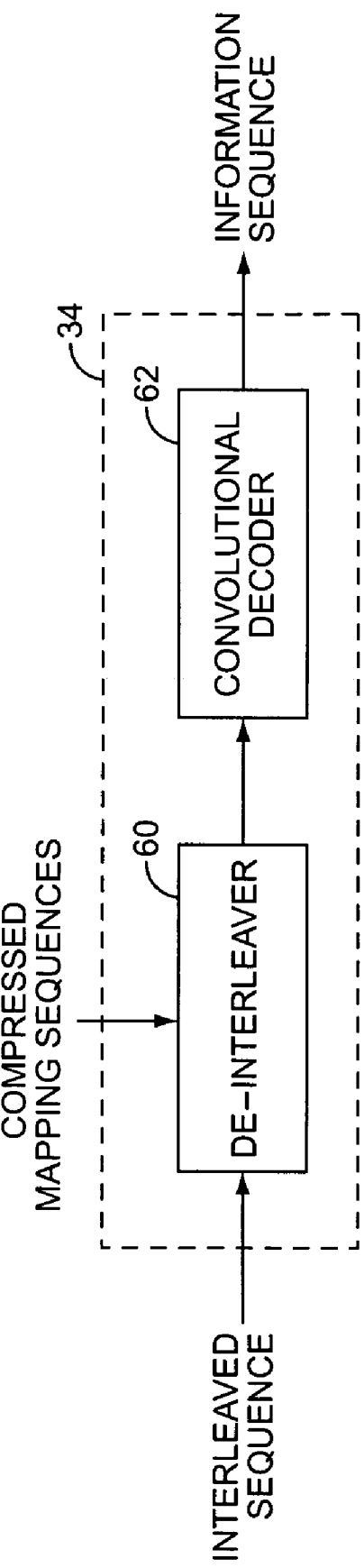
FIG. 3 is a block diagram of an exemplary channel decoder according to the present invention.

FIGS. 2 and 3 illustrate an exemplary channel encoder 24 and decoder 34, respectively. The channel encoder 24 (FIG. 2) includes an encoder 40 to encode an information sequence from the source encoder 22 and an interleaver 42 to reorder coded bits output by the encoder 40. The encoder 40 may, for example, comprise a convolutional encoder or block encoder. The interleaver 42 reorders the bits output by the encoder 40 to spread the coded bits over time to render them more resistant to burst errors.

The channel decoder 34 (FIG. 3) comprises a de-interleaver 60 followed by a decoder 62. The de-interleaver 60 reverses the process performed by the interleaver 42. In the absence of bit errors, the input sequence to the de-interleaver would be the interleaved sequence output by the interleaver 42. The de-interleaver 60 reorders the interleaved bits to return them to their original position. The output sequence from the de-interleaver 60 is the same as the coded bit sequence output by the channel encoder 40 except for any bit errors that may have occurred during transmission. The coded bit sequence is input to the decoder 62 for error detection and/or correction.

The interleaver 42 and de-interleaver 60 both employ a mapping rule to reorder input bits. The mapping rule may be expressed mathematically as a mapping function, or may be expressed as a mapping sequence, i.e. sequence of mapping values, that maps the input bit position of each input bit to a corresponding output bit position in an output bit sequence. Using an explicit mapping function to compute every output bit index requires substantial processing resources. Storing a mapping sequence in memory reduces the load on the processing resources, but at the cost of more memory. The present invention attempts to balance the use of processing and memory resources by providing a method and apparatus for compressing mapping sequences and for using the compressed mapping sequences to perform bit-mapping, e.g. interleaving and de-interleaving. The compressed mapping sequences require less memory than uncompressed mapping sequences. Use of the compressed mapping sequences to perform interleaving and de-interleaving requires less processing resources than the computation of each output index based on a mapping function.

The compression and bit-mapping method employed in the present invention is described below using the interleave mapping specified for the GSM SACCH channel, which should be viewed as a non-limiting example. The interleaver 42 for the GSM SACCH channel operates on a block of 456 bits denominated by bit indices from 0 to 455. Both interleaving and de-interleaving are a 1:1 mapping wherein the kth input bit in an input sequence is mapped to the nth position in an output bit sequence. A generalized mapping function can be expressed as:

$$n = f(k) \qquad \text{Eq. (1)}$$

where n is the output index. In the case of the GSM SACCH channel, the interleaving function can be expressed as:

$$n = f(k) = 114 \bmod(k,4) + 2 \bmod(49k,57) + \text{floor}(\bmod(k,8)/4) \qquad \text{Eq. (2)}$$

The output index n is unique for all values of k from 0 to 455. Therefore evaluating the mapping function for all values of k from 0 to 455 yields a mapping sequence that uniquely maps each input bit position to a corresponding output bit position.

To compress the mapping sequence, the mapping function $f(k)$ is decomposed into periodic component functions. Equation 2 can be rewritten as:

$$n = f(k) = f_1(k) + f_2(k) + f_3(k) \quad \text{Eq. (3)}$$

where $$f_1(k) = 114 \bmod(k,4) \quad \text{Eq. (4)}$$

$$f_2(k) = 2 \bmod(49k, 57) \quad \text{Eq. (5)}$$

$$f_3(k) = \text{floor}(\bmod(k,8)/4) \quad \text{Eq. (6)}$$

Component function $f_1(k)$ maps the bit index k for each input bit to integer multiples of 114 and repeats after every 4 bits. Component function $f_2(k)$ maps the bit index k for each input bit to even numbers between 0 and 112 and repeats after every 57 input bits. Component function $f_3(k)$ maps the bit index k for each input bit to either 0 or 1 and repeats after every 8 input bits.

Although the mapping function $f(k)$ is not periodic over the 456 bit space used by the interleaver 42 for the GSM SACCH channel, the component functions $f_1(k)$, $f_2(k)$, $f_3(k)$ are periodic within a 456 bit space. In the exemplary embodiment described herein, component functions $f_1(k)$, $f_2(k)$, $f_3(k)$ have a period of 4, 57 and 8, respectively and component function $f_2(k)$ has a period of 57. The present invention exploits the periodicity of the component functions $f_1(k)$, $f_2(k)$, $f_3(k)$ to generate compressed mapping sequences that can be stored in memory 14.

Figure 4:
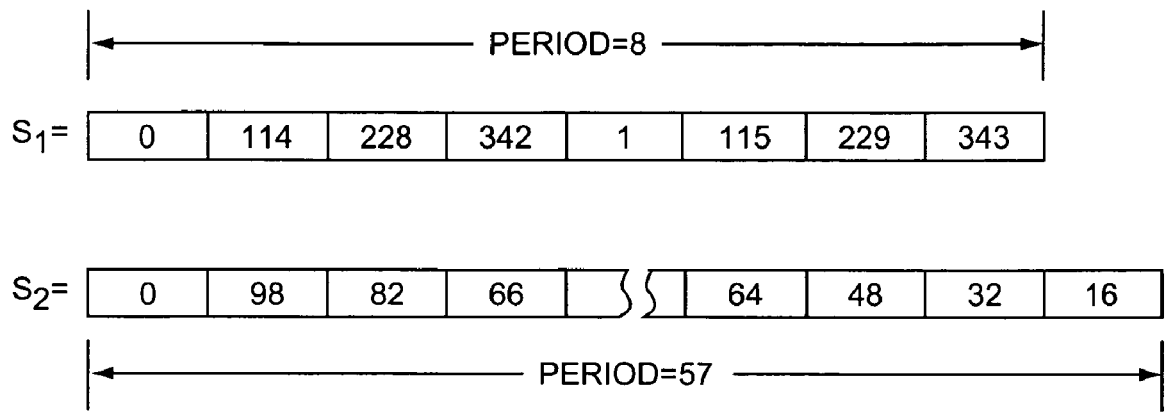
FIG. 4 is a pictorial representation of the mapping sequences in one exemplary embodiment of the invention.

FIG. 4 is a pictorial illustration of mapping sequences $S_1$ and $S_2$ derived from the component functions $f_1(k)$, $f_2(k)$, $f_3(k)$ for the GSM SACCH channel. It is recognized that two or more component functions with the same periodicity can be combined to produce a single mapping sequence. More generally, any two component functions related by $P(f_1) = mP(f_2)$, where $P(f_n)$ represents the periodicity of component function $f_n$ and m is a non-negative integer, may be combined to produce a single mapping sequence. In other words, two component functions may be combined as long as the periodicity of one component function is an integer multiple of the other component function. The periodicity of the combined mapping sequence will equal the periodicity of the component function with longest periodicity. Because the periodicity of component function $f_3(k)$ is an integer multiple of the component function $f_1(k)$, the mapping values generated by $f_1(k)$ and $f_3(k)$ are combined into one mapping sequence $S_1$ with a periodicity of 8 and stored in memory 14. Each element of the mapping sequence $S_1$ comprises a partial mapping value equal to the sum of $f_1(k)$ and $f_3(k)$ at a given bit index k. Because the sequence repeats after every 8 bits, it is necessary to store only 8 partial mapping values in the mapping sequence $S_1$ representing one period of the combined component functions $f_1(k) + f_3(k)$. Thus, all possible values of $f_1(k) + f_3(k)$ are represented by mapping sequence $S_1$. Because the component function $f_2(k)$ a period not being an integer multiple of the period of the combined component functions $f_1(k) + f_3(k)$, a separate mapping sequence $S_2$ corresponding to the component function $f_2(k)$ is stored in memory 14. Mapping sequence $S_2$ comprises 57 partial mapping values representing all possible values of $f_2(k)$. The mapping sequences $S_1$ and $S_2$ may be stored in one or more lookup tables in memory 14. For purposes of explanation, it will be assumed that mapping sequence $S_1$ is stored in a lookup table $T_1$ and that mapping sequence $S_2$ is stored in a lookup table $T_2$. This example should be considered non-limiting. Mapping sequences $S_1$ and $S_2$ could be stored in the same lookup table, or in some other type of data structure (e.g. arrays, registers, etc.).

Look-up tables $T_1$ and $T_2$ may store the partial mapping value in 16-bit words. In the example given, the look-up table $T_1$ corresponding to mapping sequence $S_1$ would comprise eight words, and the look-up table $T_2$ corresponding to mapping sequence $S_2$ would comprise 57 words. If the maximum value of a mapping sequence is less than or equal to 255, only 8 bits are required to store the partial mapping values. In this case, two partial mapping values of one byte each may be stored in a single word in the look-up table storing two partial mapping values. In the example given, the look-up table $T_1$ would therefore need only four words, and the look-up table $T_2$ would need only 29 words for a total of 33 words. For comparison, storing the complete uncompressed mapping sequence would require 456 words. Thus, the present invention results in approximately 93% compression of the mapping sequence.

An input-to-output mapping value or output index n can be computed for each input bit in an input sequence by cyclically adding the partial mapping values in each mapping sequence $S_1$ and $S_2$. The interleaving function for the GSM SACCH channel shown in Eq. 3 will be used to explain the cyclical addition process. The input bits to the interleaver 42 are the coded bits output by the channel encoder 40, denominated C(k). For each input bit C(k), corresponding partial mapping values $S_1(i)$ and $S_2(j)$ are selected from the mapping tables $T_1$ and $T_2$ based on the bit index k and summed to obtain the output index n. When the first bit (k=0) of the input sequence is input to the interleaver 42, the first mapping value in each mapping sequence is selected. The selected mapping values are summed together to obtain an input-to-output mapping value n. For each subsequent input bit, the next adjacent mapping value is selected from each mapping sequence and the selected partial mapping values are summed to get the next output index. When the end of a mapping sequence $S_1$ or $S_2$ is reached, the next partial mapping value to be selected will be the first mapping value in the mapping sequence. This process repeats until the end of the input sequence is reached. The cyclical addition of the mapping sequences $S_1$ and $S_2$ generates a decompressed mapping sequence that can then be used to map input bits C(k) in input sequence to corresponding output bits I(n) in an output sequence.

Figure 5:
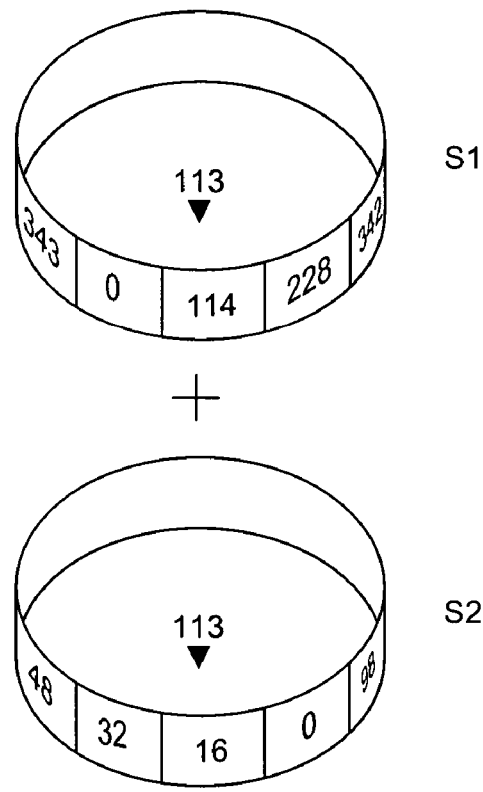
FIG. 5 is a graphic illustration of a cyclical addition method used in the present invention to add mapping values contained in the mapping sequences.

FIG. 5 graphically illustrates the cyclical addition process. As seen in FIG. 5, each mapping sequence $S_1$ and $S_2$ is formed into a ring. After each input bit, the rings index by one bit position. The marker in FIG. 5 represents the bit index of the current input bit. In FIG. 5, the 114th bit (k=113) is being mapped. The bit index is selecting the second mapping value in $S_1$ (value=114) and the 57th mapping value in $S_2$ (value=16). The output index n for the 114th bit is therefore 114+16=130. For the 115th input bit, the bit index (k=114) will select the third mapping value in $S_1$ (value=228) and the first mapping value (value=0) in $S_2$ Thus, the input/output mapping value n for the 115th bit is equal to 228. This process repeats until the end of the input sequence (bit index=455) is reached.

The cyclical addition process can be performed by computing selection indices i and j according to:

$$i = \bmod(k,8) \quad \text{Eq. (7)}$$

$$j = \bmod(k,57) \quad \text{Eq. (8)}$$

Note that the divisor in equations 7 and 8 is equal to the period of the corresponding mapping sequence. Thus, selection index i will increment from 0 to 7 repetitively and selection index j will increment from 0 to 56 repetitively. For each input bit C(k), the output index n is calculated according to:

$$n = S_1(i) + S_2(j) \quad \text{Eq. (9)}$$

Equation 9 sums the partial mapping values modulus 456 to yield a non-repeating value between 0 and 455 providing a 1:1 mapping between C(k) and I(n).

Another example is GSM full-rate speech. In the case of the GSM full-rate speech channel, the interleaving function is the same as Equation 3, where $$f_1(k)=114 \bmod(k,8) \quad \text{Eq. (10)}$$

$$f_2(k)=2 \bmod(49k,57) \quad \text{Eq. (11)}$$

$$f_3(k)=\text{floor}(\bmod(k,8)/4) \quad \text{Eq. (12)}$$

The periodicity of $f_1(k)$ and $f_3(k)$ is the same so these component functions may be combined as previously described to produce a combined mapping sequence $S_1$ with a periodicity of 8. Mapping sequence $S_1$ therefore becomes {0, 114, 228, 342, 457, 571, 685, 799}. Sequence $S_2$ will be the same as previously described. The output index is calculated according to:

$$n=\bmod(S_1(i)+S_2(j),456) \quad \text{Eq. (13)}$$

where i and j are indices as defined in Equations 7 and 8. The modulus operation in Equation 13 is required because the interleaving function for the GSM full-rate speech channel uses block-diagonal interleaving. Consequently, the index values in sequence $S_1$ exceed 456, thus requiring the modulus operation The modulus operation in Equation 13 can be eliminated to save processing resources by modifying the mapping sequence $S_1$. Rather than perform the modulus operation in real-time during the bit-mapping process, the modulus operation may be performed on mapping sequence $S_1$, which is pre-calculated and stored in memory 14. Thus, mapping sequence $S_1$ becomes:

$$S_1=\{0,114,228,342,1,115,229,343\} \quad \text{Eq. (14)}$$

With $S_1$ modified as shown in Equation 14, Equation 13 is simplified to become:

$$n=S_1(i)+S_2(j) \quad \text{Eq. (15)}$$

which is a simple addition operation.

While the present invention has been described in the context of an interleaving operation performed by the transmitter 20, those skilled in the art would recognize that the same bit mapping techniques may be used by the de-interleaver 60 at the receiver 30.

Figure 6:
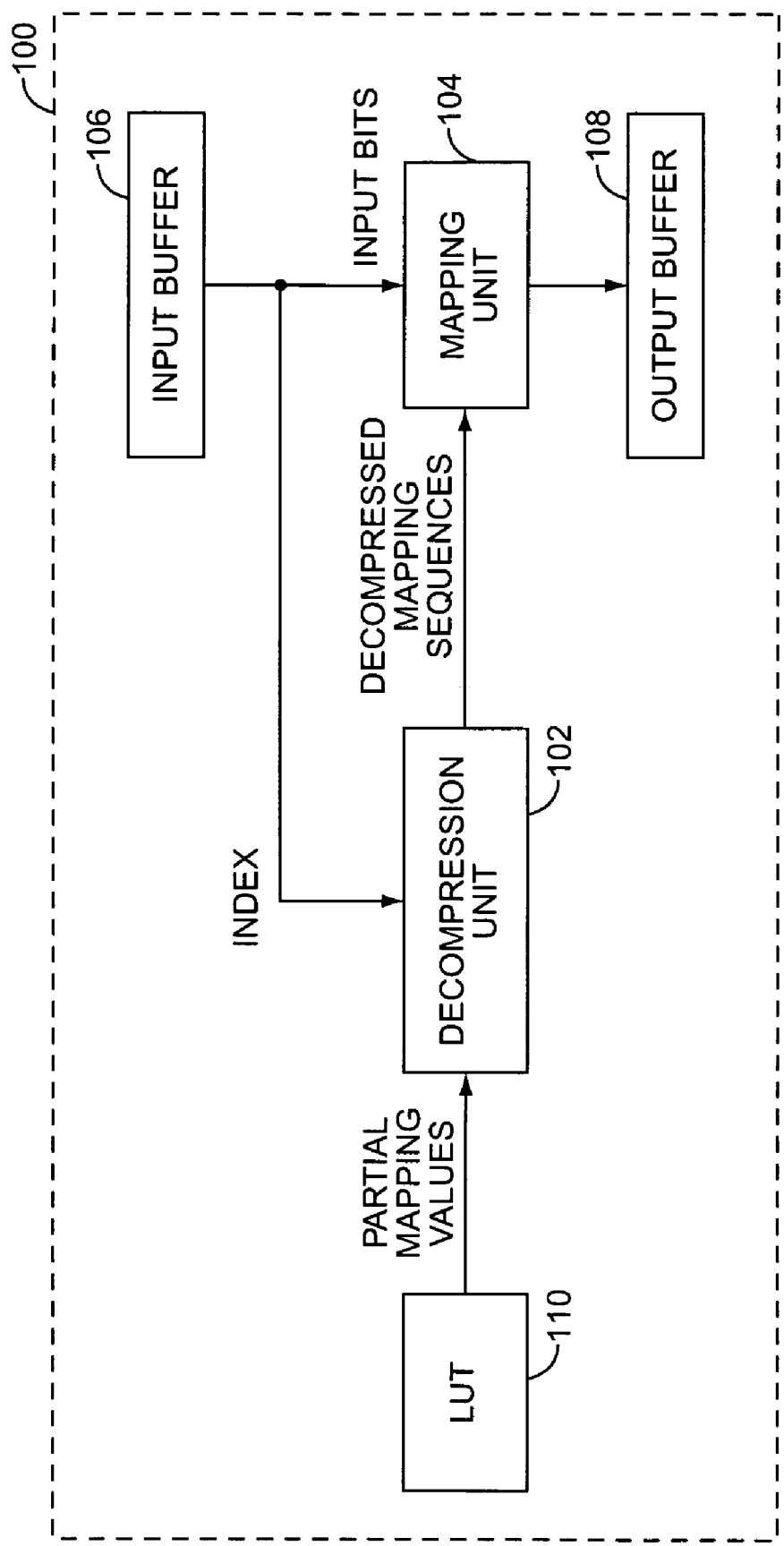
FIG. 6 is a block diagram of a mapping circuit for use in an interleaver or de-interleaver according to one embodiment of the invention.

FIG. 6 illustrates a mapping circuit 100 that may be used as an interleaver 42 or de-interleaver 60 in the communication system 10 of FIG. 1. The mapping circuit 100 comprises a decompression unit 102, a mapping unit 104, input buffer 106, and output buffer 108. The input buffer 106 stores the input sequence and inputs one input bit C(k) at a time to the mapping unit 104. The decompression unit 102 generates a decompressed mapping sequence based on the compressed mapping sequences stored in look-up table 110, which may be part of memory 14, and the bit indices k of the input bits C(k) as previously described.

For each input bit C(k) input to the mapping unit 104, the decompression unit 102 reads the corresponding partial mapping values from the lookup table 110 and computes an output index n that is output to the mapping unit 104. The mapping unit 104 maps the input bit C(k) to a corresponding location in the output buffer 108 based on the input-to-output mapping value n provided by the decompression unit 102. The sequence of consecutive output indices n is the original decompressed mapping sequence.

Figure 7:
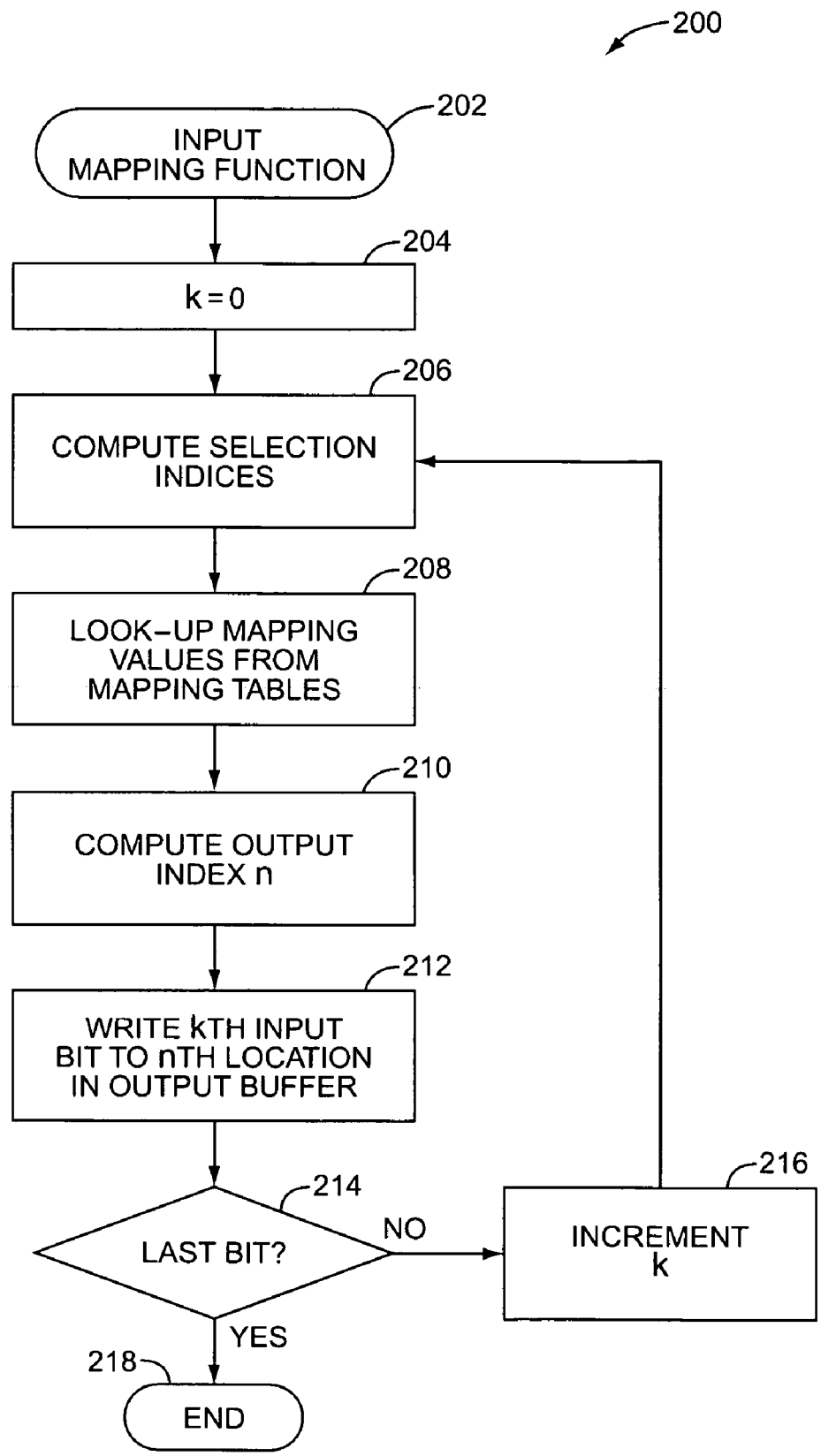
FIG. 7 is a flow chart of an exemplary bit-mapping algorithm for interleaving and de-interleaving according to one embodiment of the invention.

FIG. 7 is a flow diagram illustrating a bit mapping method 200 according to one embodiment of the present invention. The mapping process 200 begins at step 202 with the loading of an input sequence into the input buffer 106. A bit index k is initialized to "0" (block 204). The decompression unit 102 computes selection indices i and j for compressed mapping sequences $S_1$ and $S_2$, respectively, based on the bit index k (block 206) and looks up corresponding partial mapping values from look-up tables 110 in memory 14 (block 208). The decompression unit 102 then calculates the output index n, for example by summing the partial mapping values read out of look-up tables (block 210). The output index n is output to the mapping unit 104.

The output index n indicates the bit position in the output sequence of a corresponding input bit. The mapping unit 104 writes the kth input bit to the nth position in the output buffer 108. The mapping circuit 100 maps the input bits C(k) one at a time to corresponding locations in the output buffer 108 (block 212). After each input bit C(k) is mapped, the mapping circuit 100 determines whether the end of the input sequence is reached (block 214). If so, the process ends (block 218). If not, the mapping circuit 100 increments the bit index k (block 216) and repeats the mapping process (blocks 206-212) for the next input bit C(k).

Figure 8:
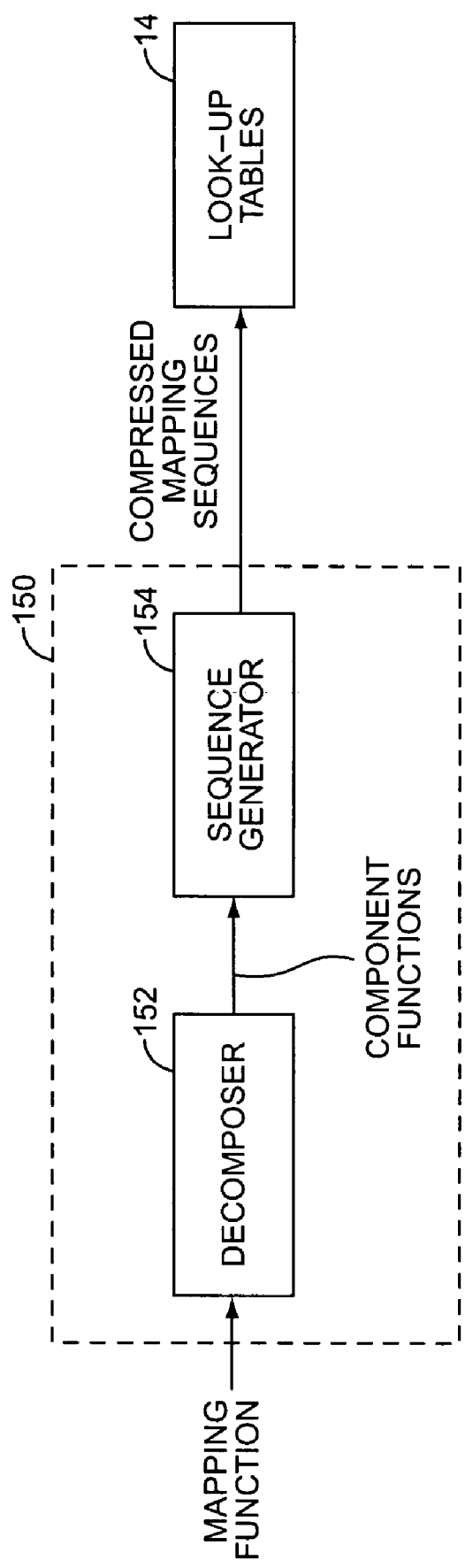
FIG. 8 is a block diagram of compression unit according to one embodiment of the present invention

FIG. 8 illustrates an exemplary compression unit 150 to generate compressed mapping sequences used in the present invention. The compression unit 150 comprises a decomposer 152 and a sequence generator 154. A mapping function $f(k)$ is input to the decomposer 152. The decomposer 152 decomposes the mapping function $f(k)$ into m periodic component functions $f_1(k), f_2(k) \ldots f_m(k)$ that are input to the sequence generator 154. The sequence generator 154 generates l compressed mapping sequences $S_1(k), S_2(k) \ldots S_l(k)$ from the component functions $f_1(k), f_2(k) \ldots f_m(k)$. In general, the number of compressed mapping sequences will be less than or equal to the number of component functions. The compressed mapping sequences $S_1(k), S_2(k) \ldots S_l(k)$ generated by the sequence generator 154 are then stored in look-up tables 110 in memory 14.

Figure 9:
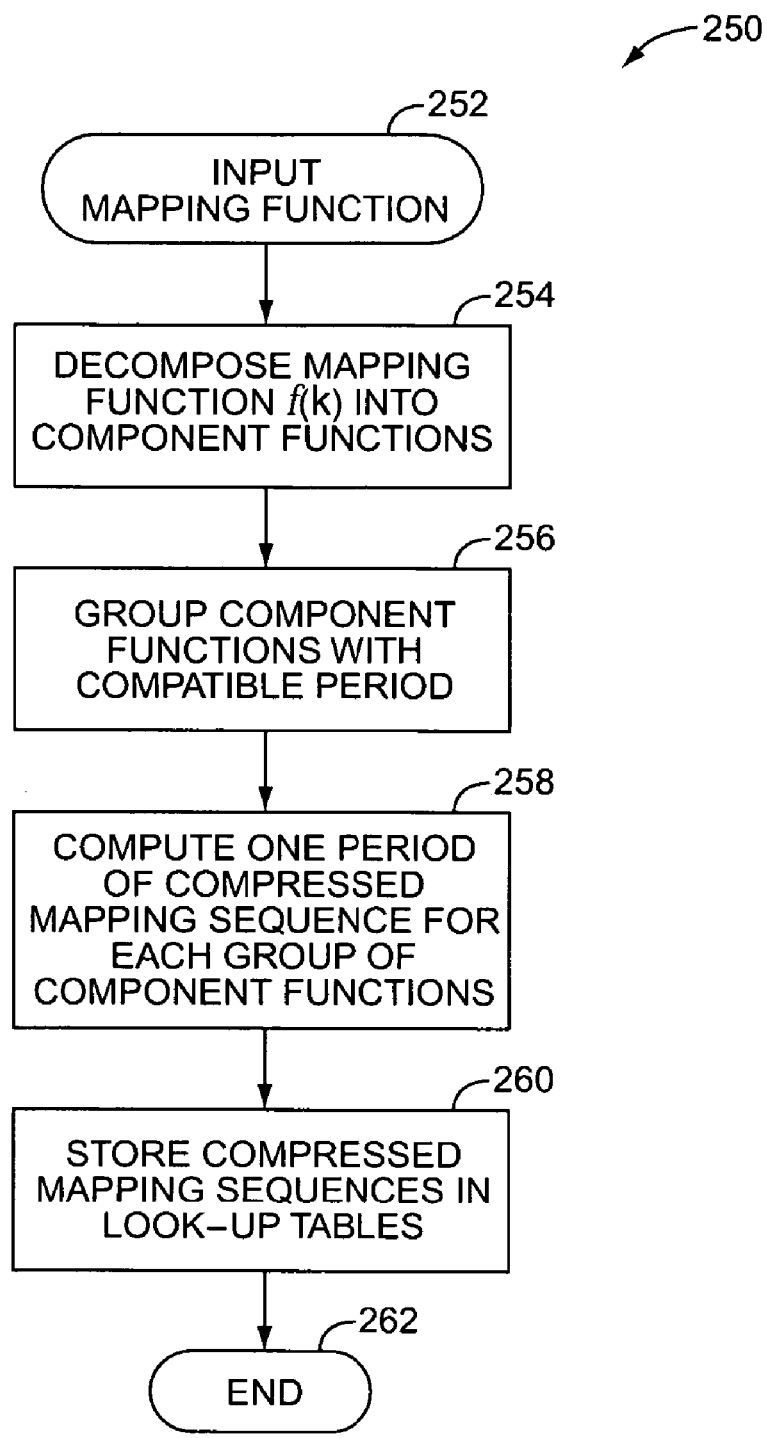
FIG. 9 is a flow chart of an exemplary compression method for compressing mapping sequences according to one embodiment of the present invention.

FIG. 9 is a flow diagram illustrating the operation of the compression unit 150 in one exemplary embodiment of the invention. The compression process 250 begins when the mapping function $f(k)$ is input to the compression unit 150 (block 252). The decomposer 152 decomposes the mapping function $f(k)$ into component functions $f_1(k), f_2(k) \ldots f_m(k)$ (block 254). The component functions $f_1(k), f_2(k) \ldots f_m(k)$ are input to the sequence generator 154, which groups component functions with the same or compatible periods (block 256). The sequence generator 154 computes a compressed mapping sequence for each group of component functions (block 258). For each group, the component functions in the group are evaluated over the longest period of the group. For each bit index k, the sequence generator 154 evaluates all component functions in a group and sums or otherwise combines the results to yield a partial mapping value. The resulting partial mapping values over the longest period of the group form a compressed mapping sequence. The compressed mapping sequences generated by the sequence generator 154 are then stored in look-up tables 110 (block 260) and the process ends (block 262).

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method implemented by a communication device of reordering bits for channel coding or channel decoding by said communication device, the method comprising:
storing in memory compressed mapping sequences derived from periodic component functions of a predetermined mapping function, each compressed mapping sequence comprising a plurality of pre-computed partial mapping values derived by evaluating said periodic component functions over one period;
for each input bit in an input bit sequence, selecting partial mapping values from said compressed mapping sequences stored in memory based on an input index of the input bit;
for each input bit in the input bit sequence, calculating an output index for the input bit based on said selected partial mapping values; and
for each input bit in the input bit sequence, mapping the input bit to its corresponding output bit position in an output bit sequence based on the corresponding output index.

2. The method of claim 1 wherein calculating an output index for the input bit in the input bit sequence based on said selected partial mapping values comprises adding the selected partial mapping values to generate the output index for the input bit.

3. The method of claim 1 wherein selecting partial mapping values from said compressed mapping sequences stored in memory based on an input index of the input bit in an input bit sequence comprises:
computing a selection index for each compressed mapping sequence based on the bit index of the input bit; and
selecting a partial mapping value from each compressed mapping sequence based on the selection index.

4. The method of claim 3 wherein computing a selection index for each compressed mapping sequence based on the bit index comprises computing a modulus of the bit index divided by the period of the compressed mapping sequence.

5. The method of claim 1 wherein storing in memory compressed mapping sequences derived from periodic component functions of a predetermined mapping function comprise storing said compressed mapping sequences in memory as lookup tables and wherein the bit index of each input bit is used to compute an index to said lookup tables to select partial mapping values.

6. The method of claim 5 wherein storing said compressed mapping sequences in memory as lookup tables comprises storing said partial mapping values as 16-bit words in said lookup tables.

7. The method of claim 6 wherein storing said compressed mapping sequences in memory as lookup tables comprises storing two one-byte partial mapping values in a 16-bit word in at least one lookup table.

8. The method of claim 1 wherein each compressed mapping sequence comprises one period of a corresponding component function or group of component functions.

9. The method of claim 8 wherein at least one of said compressed mapping sequences is derived from a combination of two or more periodic component functions.

10. The method of claim 1 wherein calculating an output index for the input bit in the input bit sequence based on said selected partial mapping values comprises cyclically adding partial mapping values from each compressed mapping sequence to obtain a decompressed mapping sequence.

11. The method of claim 1 wherein said predetermined mapping function is an interleaving function.

12. The method of claim 1 wherein said predetermined mapping function is a de-interleaving function.

13. A mapping circuit for reordering bits for channel coding or channel decoding by a communication device, the mapping circuit comprising:
memory to store compressed mapping sequences derived from periodic component functions of a predetermined mapping function, each compressed mapping sequence comprising a plurality of pre-computed partial mapping values derived by evaluating said periodic component functions over one period;
a decompression unit to select, for each input bit in an input bit sequence, partial mapping values from each compressed mapping sequence based on a corresponding bit index for the input bit, and to calculate, for each input bit, corresponding output indexes for each said input bit to generate a decompressed mapping sequence; and
a mapping unit to map each input bit in said input bit sequence to its corresponding output bit position based on the corresponding output index.

14. The mapping circuit of claim 13 wherein the decompression unit is configured to calculate the output index for each input bit by summing selected partial mapping values.

15. The mapping circuit of claim 13 wherein the decompression unit is configured to generate partial mapping values for each input bit by:
computing a selection index for each compressed mapping sequence based on the bit index of the input bit; and
selecting a partial mapping value from each compressed mapping sequence based on the selection index.

16. The mapping circuit of claim 15 wherein the decompression unit is configured to compute a selection index for each compressed mapping sequence based on the bit index comprises by computing a modulus of the bit index divided by the period of said compressed mapping sequence.

17. The mapping circuit of claim 13 wherein said memory is configured to store each compressed mapping sequence as a lookup table and wherein the bit index of each input bit is used to compute an index to said lookup tables to select a partial mapping value for mapping a current input bit.

18. The mapping circuit of claim 17 wherein said memory is configured to store said partial mapping values in said lookup tables as 16 bit words.

19. The mapping circuit of claim 18 wherein said memory is configured to store two one-byte partial mapping values in a 16-bit word in at least one lookup table.

20. The mapping circuit of claim 13 wherein each compressed mapping sequence comprises one period of a corresponding component function or group of component functions.

21. The mapping circuit of claim 20 wherein at least one of said compressed mapping sequences is derived from a combination of two or more periodic component functions.

22. The mapping circuit of claim 13 wherein said decompression unit is configured to generate said output index for each input bit by cyclically adding partial mapping values from each compressed mapping sequence to obtain a decompressed mapping sequence.

23. The mapping circuit of claim 13 wherein said mapping circuit is an interleaver.

24. The mapping circuit of claim 13 wherein said mapping circuit is a de-interleaver.

25. A computer readable media with a computer-executable instructions stored thereon for causing a processor in a communication device to reorder bits for channel coding or channel decoding by said communication device, said computer-executable instructions comprising instructions for:

selecting, for each input bit in an input bit sequence, partial mapping values from compressed mapping sequences stored in memory based on a corresponding input index of the input bit, each compressed mapping sequence comprising a plurality of pre-computed partial mapping values derived by evaluating a periodic component function of said mapping function over one period;

calculating, for each input bit, an output index for the input bit based on said selected partial mapping values to generate a decompressed mapping sequence; and mapping each input bit to an output bit position based on a corresponding output index.

26. The method of claim 25 wherein the code to calculate and output index sums the selected partial mapping values to generate the output index for the input bit.

27. The computer readable media of claim 25 wherein said computer program is an interleaving program.

28. The computer readable media of claim 25 wherein said computer program is an de-interleaving program.

* * * * *

UNITED STATES PATENT AND TRADEMARK OFFICE
CERTIFICATE OF CORRECTION

PATENT NO.       : 7,600,164 B2
APPLICATION NO. : 11/016643
DATED            : October 6, 2009
INVENTOR(S)      : Dayong Chen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 534 days.

Signed and Sealed this

Fifth Day of October, 2010

David J. Kappos
*Director of the United States Patent and Trademark Office*